US 8,090,929 B2

(12) United States Patent
Magee et al.

(10) Patent No.: US 8,090,929 B2
(45) Date of Patent: Jan. 3, 2012

(54) GENERATING CLOCK SIGNALS FOR COUPLED ASIC CHIPS IN PROCESSOR INTERFACE WITH X AND Y LOGIC OPERABLE IN FUNCTIONAL AND SCANNING MODES

(75) Inventors: Jeffrey A. Magee, Poughkeepsie, NY (US); Timothy Gerard McNamara, Fishkill, NY (US); Walter Niklaus, Jettingen (DE); Scott Barnett Swaney, Germantown, NY (US); Tobias Webel, Gmuend (DE)

(73) Assignee: International Business Machines Corporation, Armonk, NY (US)

( * ) Notice: Subject to any disclaimer, the term of this patent is extended or adjusted under 35 U.S.C. 154(b) by 604 days.

(21) Appl. No.: 12/236,551

(22) Filed: Sep. 24, 2008

(65) Prior Publication Data

US 2009/0217000 A1    Aug. 27, 2009

Related U.S. Application Data

(60) Provisional application No. 61/031,454, filed on Feb. 26, 2008.

(51) Int. Cl.
*G06F 1/04* (2006.01)

(52) U.S. Cl. .............................. 712/38; 712/36; 713/500
(58) Field of Classification Search ....................... None
See application file for complete search history.

(56) References Cited

U.S. PATENT DOCUMENTS

| 5,444,715 A * | 8/1995 | Gruetzner et al. ............ 714/727 |
| 2006/0179184 A1 | 8/2006 | Fields, Jr. et al. |

* cited by examiner

*Primary Examiner* — Kenneth Kim
(74) *Attorney, Agent, or Firm* — Schmeiser, Olsen & Watts

(57) ABSTRACT

A digital system and method of operating the same. The system comprises a processor chip including a first elastic interface domain, wherein the first elastic interface domain comprises a first processor X logic and a first processor Y logic, wherein the first processor X and Y logic comprise first X and Y latches, respectively; and a first ASIC chip electrically coupled to the processor chip, wherein the first processor X and Y logics are configured to be simultaneously in a functional mode, wherein the first processor X logic is configured to switch from the functional mode to a scanning mode while the first processor Y logic remains in the functional mode, and wherein in response to the first processor Y logic being in the functional mode, the first processor Y logic is configured to generate a first reference ASIC clock signal to the first ASIC chip.

20 Claims, 4 Drawing Sheets

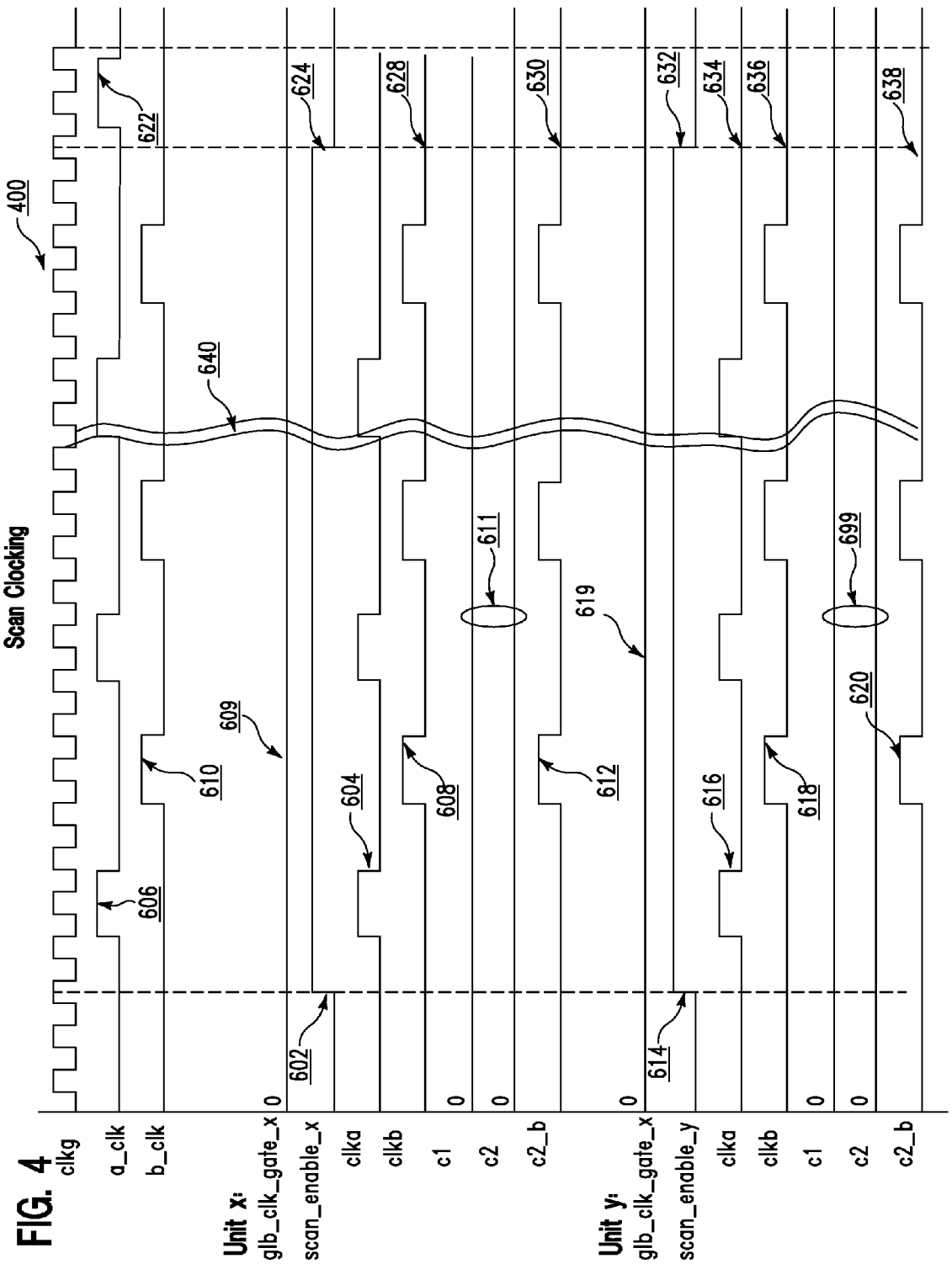

GENERATING CLOCK SIGNALS FOR COUPLED ASIC CHIPS IN PROCESSOR INTERFACE WITH X AND Y LOGIC OPERABLE IN FUNCTIONAL AND SCANNING MODES

This application is a non-provisional application claiming priority to provisional application 61/031,454, filed Feb. 26, 2008.

FIELD OF THE INVENTION

The present invention relates generally to clock signals, and more particularly to clock signals in digital systems.

BACKGROUND OF THE INVENTION

In a conventional digital system, it is difficult to provide clock signals to all chips of the digital system so that all the chips can go through initialization simultaneously. Therefore, there is a need for structures (and methods of operating the same) in which clock signals are provided to all chips of the system during initialization.

SUMMARY OF THE INVENTION

The present invention provides a digital system, comprising a processor chip which includes a first elastic interface domain, wherein the first elastic interface domain comprises a first processor X logic and a first processor Y logic, wherein the first processor X logic comprises first X latches, and wherein the first processor Y logic comprises first Y latches; and a first ASIC (application-specific integrated circuit) chip electrically coupled to the processor chip, wherein the first processor X logic and the first processor Y logic are configured to be simultaneously in a functional mode, wherein the first processor X logic is configured to switch from the functional mode to a scanning mode while the first processor Y logic remains in the functional mode, and wherein in response to the first processor Y logic being in the functional mode, the first processor Y logic is configured to generate a first reference ASIC clock signal to the first ASIC chip.

The present invention provides structures (and methods of operating the same) in which clock signals are provided to all chips of the system during initialization.

BRIEF DESCRIPTION OF THE DRAWINGS

FIG. 4 shows a timing diagram of different signals when the X logic and the Y logic of FIG. 2 are in a scanning mode, in accordance with embodiments of the present invention

DETAILED DESCRIPTION OF THE INVENTION

Figure 1:
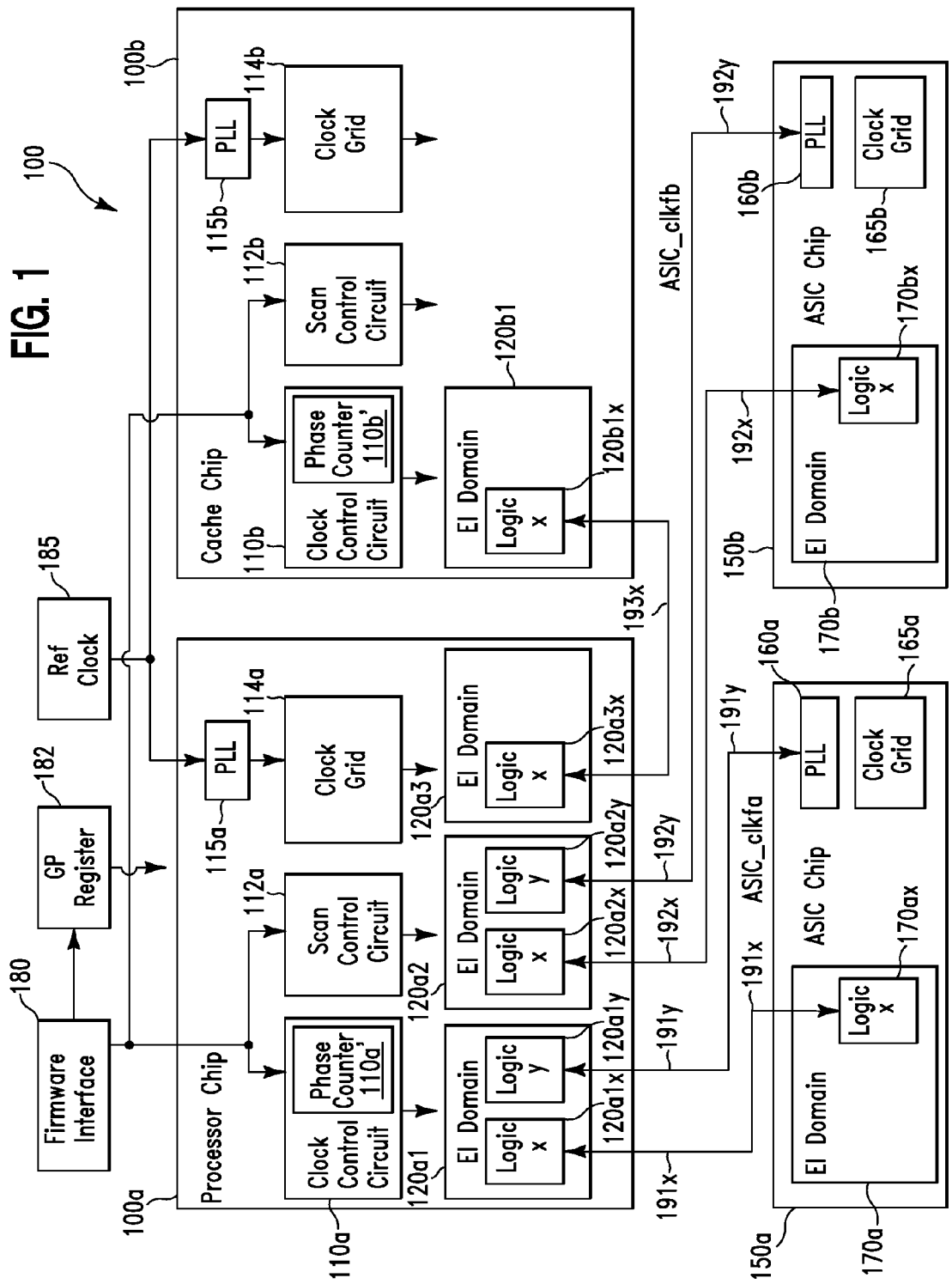
FIG. 1 shows a digital system, in accordance with embodiments of the present invention.

FIG. 1 illustrates a digital system 100, in accordance with embodiments of the present invention. More specifically, the digital system 100 can comprise a processor chip 100a, a cache chip 100b, ASIC (application-specific integrated circuit) chips 150a and 150b, firmware interface 180, a general purpose (GP) register 182, and a reference clock generator 185.

In one embodiment, the processor chip 100a comprises a phase lock loop (PLL) 115a, a clock control circuit 110a including a phase counter 110a', a scan control circuit 112a, a clock grid 114a, and elastic interface (EI) domains 120a1, 120a2, and 120a3. The EI domain 120a1 can comprise a logic X 120a1X (also referred to as the X logic 120a1X or the processor X logic 120a1X) and a logic Y 120a1Y (also referred to as the Y logic 120a1Y or the processor Y logic 120a1Y). The EI domain 120a2 can comprise a logic X 120a2X (also referred to as the X logic 120a2X or the processor X logic 120a2X) and a logic Y 120a2Y (also referred to as the Y logic 120a2Y or the processor Y logic 120a2Y). The EI domain 120a3 can comprise a logic X 120a3X (also referred to as the X logic 120a3X or the processor X logic 120a3X).

In one embodiment, similarly, the cache chip 100b comprises a phase lock loop (PLL) 115b, a clock control circuit 110b including a phase counter 110b', a scan control circuit 112b, a clock grid 114b, and an elastic interface (EI) domains 120b1. The EI domain 120b1 can comprise a logic X 120b1X (also referred to as the X logic 120b1X or the cache X logic 120b1X).

In one embodiment, the ASIC chip 150a comprises an EI domain 170a, a PLL 160a, and a clock grid 165a. The EI domain 170a can comprise a logic X 170aX (also referred to as the X logic 170aX or the ASIC X logic 170aX). Similarly, the ASIC chip 150b can comprise an EI domain 170b, a PLL 160b, and a clock grid 165b. The EI domain 170b can comprise a logic X 170bX (also referred to as the X logic 170bX or the ASIC X logic 170bX).

In one embodiment, the structures of the X logics 120a1X, 120a2X, 120a3X, 120b1X, 170aX, and 170bX are similar to one another, whereas the structures of the Y logics 120a1Y and 120a2Y are similar to each other.

Figure 2:
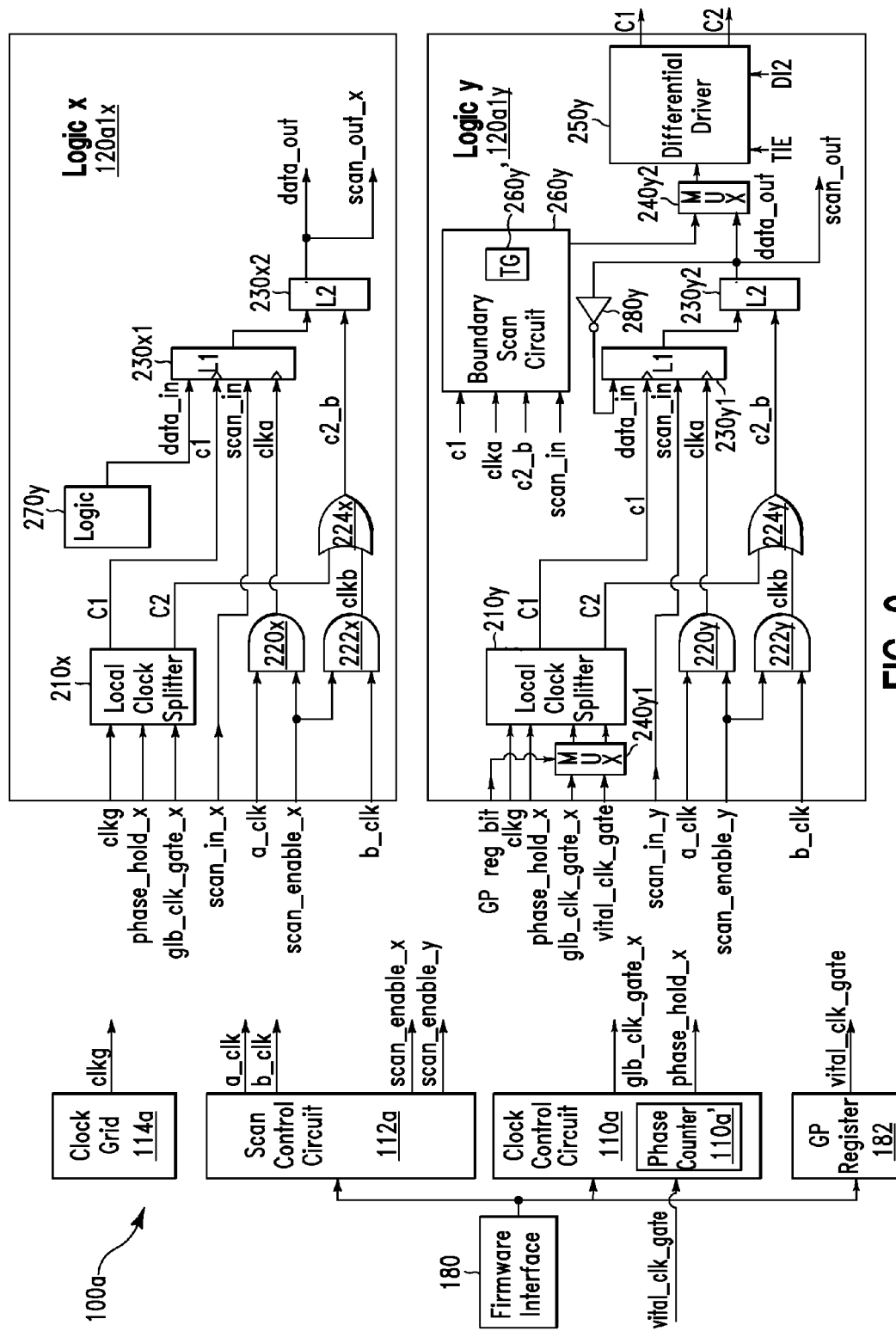
FIG. 2 shows an X logic and a Y logic of the digital system of FIG. 1, in accordance with embodiments of the present invention.

FIG. 2 illustrates one embodiment of the X logic 120a1X and the Y logic 120a1Y of the EI domain 120a1 of the processor chip 100a of FIG. 1, in accordance with embodiments of the present invention. More specifically, the X logic 120a1X can comprise a local clock splitter 210X, two AND gates 220X and 222X, an OR gate 224X, a logic 270X, and two latches 230X1 and 230X2 (also referred to as the X latches 230X1 and 230X2) electrically coupled together as shown.

In one embodiment, the Y logic 120a1Y can comprise a local clock splitter 210Y, two AND gates 220Y and 222Y, an OR gate 224Y, a boundary scan circuit 260Y, two latches 230Y1 and 230Y2 (also referred to as the Y latches 230Y1 and 230Y2), two multiplexers (MUXes) 240Y1 and 240Y2, a differential driver 250Y, and an inverter 280Y electrically coupled together as shown. It should be noted that the latches 230Y1 and 230Y2 and the inverter 280Y residing on a feedback path of the latches 230Y1 and 230Y2 constitute a toggle latch 230Y1+230Y2+280Y.

Clock Running State (Also Referred to as Functional Mode).

Figure 3:
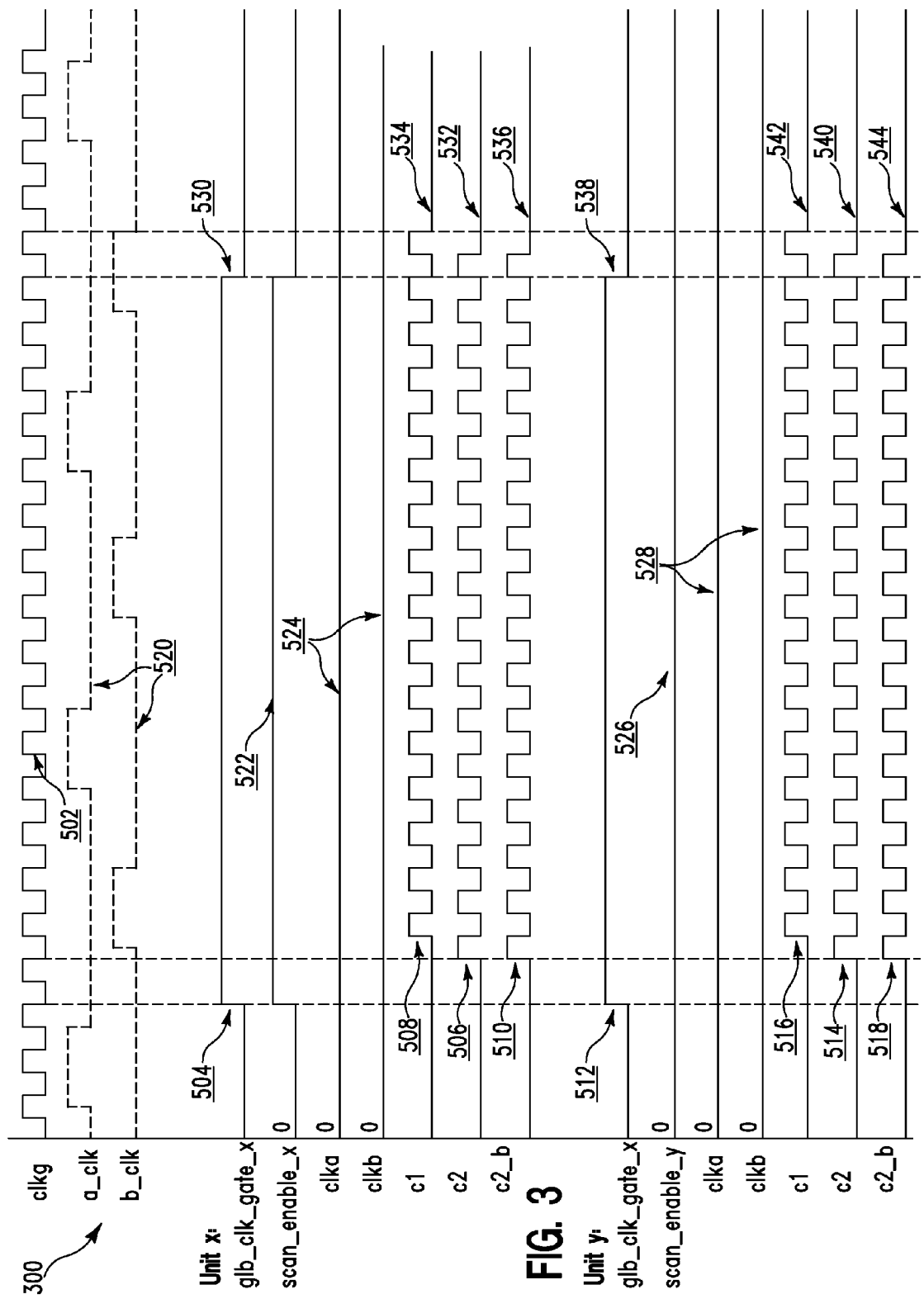
FIG. 3 shows a timing diagram of different signals when the X logic and the Y logic of FIG. 2 are in a functional mode, in accordance with embodiments of the present invention.

FIG. 3 illustrates a timing diagram 300 of different signals when both the X logic 120a1X and the Y logic 120a1Y (FIG. 2) enter, operate in, and then exit a functional mode, in accordance with embodiments of the present invention. A logic is said to operate in the functional mode if its latches operates under the condition of glb_clk_gate=1, scan_enable=0, signal clkg toggling, resulting in clka=clkb=0, and c1 and c2_b as shown in FIG. 3.

With reference to FIGS. 1-3, first, the firmware interface 180 issues a functional start command to the clock control circuit 110a so as to start the clocks for both the X logic 120a1X and the Y logic 120a1Y at the same time (resulting in the X logic 120a1X and the Y logic 120a1Y entering the functional mode). More specifically, in response to the functional start command, the clock control circuit 110a asserts signal glb_clk_gate_x to ONE (504 and 512 of FIG. 3) resulting in the local clock splitters 210X and 210Y activating their clock outputs c1 and c2 (assuming that in the Y logic 120a1Y, the MUX 240Y1 electrically couples signal glb_clk_gate_x to the local clock splitter 210Y). As shown in FIG. 3, the c2 clocks activate (506 and 514) out-of-phase with clkg (502) from the clock grid 114a whereas the c1 clocks activate (508 and 516) in-phase with clkg (502).

The global scan clocks a_clk and b_clk (520) generated by the scan control circuit 112a can be active or inactive, depending on whether a scan operation is being performed to some other functional unit(s) on the processor chip 100a. However, regardless of whether a_clk and b_clk are active or inactive, because scan enable signals scan_enable_x (522) and scan_enable_y (526) are inactive (low), local scan clocks clka and clkb (524 and 528) are both inactive (low).

Because local scan clock clkb is inactive (low), the c2_b signals (510 and 518) simply follow c2 (506 and 514) from the output of the local clock splitters (210X and 210Y). Also, because c1 and c2 are out-of-phase with each other, signals c1 and c2_b are also out-of-phase with each other.

While the X logic 120a1X and the Y logic 120a1Y are in the functional mode, the latches 230X1, 230X2, 230Y1, and 230Y2 can store functional data.

Then, the firmware interface 180 issues a functional stop command to the clock control circuit 110a so as to stop the clocks for both the X logic 120a1X and the Y logic 120a1Y at the same time (resulting in the X logic 120a1X and the Y logic 120a1Y exiting the functional mode). More specifically, in response to the functional stop command, the clock control circuit 110a deasserts signal glb_clk_gate_x to ZERO (530 and 538) resulting in the local clock splitters 210X and 210Y deactivating their clock outputs c1 and c2 (534, 532, 542, and 540). Again, because the c2_b signals simply follow the c2 outputs of the local clock splitter splitters 210X and 210Y, the c2_b signals also stop (536 and 544).

Scanning Mode.

FIG. 4 illustrates a timing diagram 400 of different signals when both the X logic 120a1X and the Y logic 120a1Y (FIG. 2) enter, operate in, and then exit a scanning mode, in accordance with embodiments of the present invention. A logic is said to operate in the scanning mode if its latches operates in the condition of glb_clk_gate=0, scan_enable=1, resulting in clka following a_clk, clkb following b_clk, c2_b following b_clk, and c1=c2=0. It should be noted that at a given point in time, a logic can operate in the functional mode or the scanning mode, but not both.

With reference to FIGS. 1-2 and 4, first, the firmware interface 180 issues a scan start command to the scan control circuit 112a to select both the X logic 120a1X and the Y logic 120a1Y of the processor chip 100a for scanning. In response, the scan control circuit 112a activates the scan enable signals scan_enable_x (602) and scan_enable_y (614). Then, the scan control circuit 112a activates the global scan clocks a_clk (606) and b_clk (610) resulting in the X logic 120a1X and the Y logic 120a1Y entering the scanning mode. While the X logic 120a1X and the Y logic 120a1Y are in the scanning mode, scan values are serially shifted through a scan chain which is not shown but includes the latches 230X1, 230X2, 230Y1, 230Y2 of the X logic 120a1X and the Y logic 120a1Y.

In one embodiment, the firmware interface 180 includes in the scan start command the number of latches in the scan chain so that the scan control circuit 112a can supply the correct number of pulses in the global scan clocks a_clk (606) and b_clk (610) for the number of bits to be shifted through the scan chain. The gap 640 in the timing diagram 400 illustrates that the illustrated repetitive pattern may continue for longer than is actually shown on FIG. 4.

The global scan clocks a_clk and b_clk are ANDed (by AND gates 220X, 222X, 220Y, and 222Y0 of FIG. 2) with the scan enable signals scan_enable_x and scan_enable_y in the X logic 120a1X and the Y logic 120a1Y.

For the X logic 120a1X, because scan_enable_x is active (602), the local/internal scan clock clka (604) follows the global scan clock a_clk (606), and the local/internal scan clock clkb (608) follows the global scan clock b_clk (610). Because glb_clk_gate_x is inactive (609), the c1 and c2 clocks from the local clock splitter 210X are inactive (611) resulting in signal c2_b (612) following the local scan clock clkb (608).

Similarly, for the Y logic 120a1Y, since scan_enable_y is active (614), the local/internal scan clock clka (616) follows the global scan clock a_clk (606), and the local scan clock clkb (618) follows the global scan clock b_clk (610). Because glb_clk_gate_x is inactive (619), the c1 and c2 clocks from the local clock splitter 210Y are inactive (699) resulting in signal c2_b (620) following the local scan clock clkb (618) (assuming that in the Y logic 120a1Y, the MUX 240Y1 electrically couples signal glb_clk_gate_x to the local clock splitter 210Y).

In one embodiment, after shifting the desired number of positions/bits in the scan chain, the firmware interface 180 sends a scan stop command to the scan control circuit 112a to terminate the scan operation. In response, the scan control circuit 112a deactivates both scan_enable_x (624) and scan_enable_y (632) resulting in the X logic 120a1X and the Y logic 120a1Y exiting the scanning mode. In one embodiment, the scan control circuit 112a also stops driving the global scan clocks a_clk and b_clk.

In an alternative embodiment, the scan control circuit 112a continues driving the global scan clocks a_clk and b_clk (622) after the scan operation ends. However, this would not make any difference because for the X logic 120a1X, scan_enable_x becoming inactive (624) will always deassert (i.e., pull to ZERO) the local scan clocks clka and clkb (628) and c2_b (630) which follows clkb (628). Similarly, for the Y logic 120a1Y, scan_enable_y becoming inactive (632) will deassert (i.e., pull to ZERO) the local scan clocks clka (634) and clkb (636) and c2_b (638) which follows clkb (636).

System Initialization

With reference to both FIGS. 1 and 2, in one embodiment of the present inventions, the initialization of the digital system 100 with respect to the X logic 120a1X and the Y logic 120a1Y of the EI domain 120a1 of the processor chip 100a and with respect to the ASIC chip 150a is as follows.

First, during early machine boot time, with the presence of reference clock signal clkf from the reference clock generator 185 (FIG. 1), the firmware interface 180 accesses the clock control circuit 110a in the processor chip 100a. More specifically, the firmware interface 180 causes the clock control circuit 110a to assert signal glb_clk_gate_x to ONE (i.e., high) to the local clock splitter 210X of the X logic 120a1X. The firmware interface 180 also sets the GP register 182 to ZERO causing the MUX 240Y to electrically connect signal glb_clk_gate_x being ONE to the local clock splitter 210Y of the Y logic 120a1Y. Because both the local clock splitters 210X and 210Y receives value ONE of signal glb_clk_gate_x from the control circuit 110a, both the X logic 120a1X and the Y logic 120a1Y of the EI domain 120a1 enters the functional mode.

Next, in one embodiment, the firmware interface 180 sets the GP register 182 to ONE causing the MUX 240Y to electrically connect signal vital_clk_gate being ONE to the local clock splitter 210Y. As a result, the Y logic 120a1Y remains in the functional mode.

Next, in one embodiment, the firmware interface 180 deasserts signal glb_clk_gate_x to ZERO (i.e., low) to the local clock splitter 210X. As a result, the X logic 120a1X exits the functional mode while the Y logic 120a1Y remains in the functional mode.

With the Y logic 120a1Y remaining in the functional mode and with input DI1 of the differential driver 250Y being tied to ZERO (i.e., TIE) and input DI2 being controlled to ZERO by logic (not shown) controlled by the firmware interface 180, an early reference clock signal ASIC_clkfa (also referred to as reference ASIC clock signal ASIC_clkfa) is available at outputs of the differential driver 250Y of the Y logic 120a1Y and therefore is available to the ASIC chip 150a via connection 191Y (FIG. 1). With the presence of early reference clock signal ASIC_clkfa, in one embodiment, the firmware interface 180 starts the initialization of the ASIC chip 150a.

In one embodiment, with the X logic 120a1X exiting the functional mode, the firmware interface 180 asserts signal scan_enable_x to ONE causing the X logic 120a1X to enter the scanning mode. In the scanning mode, a scan pattern can be scanned into the X logic 120a1X so that a LBIST (Logical Built in Self test) can be performed.

In one embodiment, while the X logic 120a1X is in the scanning mode, the Y logic 120a1Y remains in the functional mode. As a result, while the LBIST is performed on the X logic 120a1X, clock signal ASIC_clkfa is available to the ASIC chip 150a such that the X logic 170aX of the ASIC chip 150a can also be in either the scanning mode or the functional mode. It should be noted that the role of clock signal ASIC_clkfa to the ASIC chip 150a is similar to the role of clock signal clkf (generated by the reference clock generator 185) to the processor chip 100a.

In one embodiment, the firmware interface 180 controlling the processor chip 100a is able to scan an initial data pattern into the X logic 120a1X which may need prior starting the clocks of the X logic 120a1X. LBIST and scanning are sequences which may take quite some time. With early clock signal ASIC_clkfa to the ASIC Chip 150a, the firmware interface 180 controlling the ASIC chip 150a can perform LBIST and scanning operations in the ASIC Chip 150a in the parallel to the LBIST and scanning operations in the X logic 120a1X.

In one embodiment, the Y logic 120a1Y is not part of LBIST operation on the X logic 120a1X. A minimal test coverage number degradation has to be taken into account.

In one embodiment, during LBIST operation of the processor chip 100a, the differential drivers and receivers of the X logic 120a1X (not shown but similar to the differential driver 250Y of the Y logic 120a1Y) should not drive any garbage on the external lines. Therefore, for these drivers/receivers, their DI1 inputs are asserted to ONE, whereas their DI2 inputs are "don't care".

In one embodiment, for the Y logic 120a1Y, the control signals DI1 and DI2 of the differential driver 250Y are separated so that early clock signal ASIC_clkfa is available to the ASIC chip 150a during LBIST and scanning operations of the ASIC chip 150a.

In one embodiment, after scanning operation of the processor chip 100a, the firmware interface 180 causes the clock control circuit 110a to assert signal glb_clk_gate_x to ONE resulting in the clocks to the X logic 120a1X being again started. After the ASIC chip 150a goes through LBIST and scanning operations and the clock start processes, the regular data traffic between the processor chip 100a and the cache chip 100b and between the processor chip 100a and the ASIC chip 150a is established.

In one embodiment, when the X logic 120a1X enters the functional mode again on the processor chip 100a, the X logic 120a1X and the Y logic 120a1Y are phase aligned. "Phase aligned" means that the value of the toggle latch 230Y1+230Y2+280Y of the Y logic 120a1Y is always the same when the first active clock pulse of the X logic 120a1X is asserted. When the Y logic 120a1Y is started just based on signal vital_clk_gate at the beginning, it would not be predictable if the Y logic 120a1Y's toggle latch value is ZERO or ONE when the first active clock pulse is asserted for the X logic 120a1X.

In one embodiment, the phase alignment between the X logic 120a1X and the Y logic 120a1Y is a prerequisite for a functional elastic data interface between the processor chip 100a and the ASIC chip 150a.

In one embodiment, the boundary scan circuit 260Y comprises a toggle latch 260Y' similar to the toggle latch 230Y1+230Y2+280Y. As a result, this toggle latch 260Y' of the boundary scan circuit 260Y can be used to generate early reference clock signal ASIC_clkfa through the MUX 240Y2 and the differential driver 250Y to the ASIC chip 150a.

In one embodiment, the toggle latch 260Y' of the boundary scan circuit 260Y is isolated from scan operation so that during the scan operation on the X logic 120a1X, the toggle latch 260Y' of the boundary scan circuit 260Y can still generate early reference clock signal ASIC_clkfa through the MUX 240Y2 and the differential driver 250Y to the ASIC chip 150a.

In one embodiment, after selftest is done for the X logic 120a1X and the Y logic 120a1Y, the driving of early reference clock signal ASIC_clkfa to the ASIC chip 150a is switched from the toggle latch 260Y' of the boundary scan circuit 260Y to the toggle latch 230Y1+230Y2+280Y. In one embodiment, the timing of this switchover event is chosen in a way so that the ASIC chip 150a is immune at that point in time against a single corruption of early reference clock signal ASIC_clkfa.

In one embodiment, with reference to FIG. 1, the structures and operations of the other X logics in the digital system 100 (FIG. 1) are similar to the structure and operation of the X logic 120a1X, whereas the structures and operations of the other Y logics in the digital system 100 (FIG. 1) are similar to the structure and operation of the Y logic 120a1Y. The structure and operation of the ASIC chip 150b is similar to the structure and operation of the ASIC chip 150a. The role and operation of the early reference clock signal ASIC_clkfb (also referred to as reference ASIC clock signal ASIC_clkfa) with respect to the ASIC chip 150b are similar to the role and operation of the early reference clock signal ASIC_clkfa with respect to the ASIC chip 150a.

In one embodiment, the presence of the phase counters 110a' and 110b' on the chips 100a and 100b helps different EI domains on a given chip run synchronously from a clocking point of view. This leads to a synchronous running clock on all ASIC Chips connected to this given chip.

In one embodiment, the processor chip 100a and the cache chip 100b are synchronous to each other. This leads to system wide synchronism between the processor chip 100a and the cache chip 100b, and all connected ASIC Chips 150a and 150b from a clocking point of view.

In summary, with reference to FIG. 1, while the LBIST and scanning operations are performed on the X logics of the processor chip 100a (i.e., the X logics of the processor chip 100a are in the scanning mode), the Y logics of the processor chip 100a remain in the functional mode resulting in the presence of early reference clock signal ASIC_clkfa and ASIC_clkfa to the ASIC chips 150a and 150b, respectively. As a result, the ASIC chips 150a and 150b can operate in the functional mode or scanning mode while the X logics of the processor chip 100a undergo LBIST and scanning operations. For instance, the ASIC chips 150a and 150b can undergo their own LBIST and scanning operations while the X logics of the processor chip 100a undergo LBIST and scanning operations.

In the embodiments described above, the clock signal clkf generated by the reference clock generator 185 can be distributed across the entire system 100 using a grid structure 114a+114b+165a+165b for balanced electrical characteristics.

In the embodiments described above, the scan control circuits 112a and 112b (FIG. 1) can provide independent scan-enable signals for each X or Y logic of the system 100 which determine whether the latches in each corresponding logic will be included in a scan operation or not.

In the embodiments described above, the clock control circuits 110a and 110b (FIG. 1) can contain state machines and latches (similar to those of the X logic 120a1X and the Y logic 120a1Y of FIG. 2) which also run from the clock grids 114a and 114b, respectively. The clock control circuit 110a receives a separate clock gate signal (i.e., vital_clk_gate) from GP register 182 (FIG. 2) which is set by the firmware interface 180. Because the vital_clk_gate signal is driven by the GP register 182 from the firmware interface 180, vital_clk_gate is activated asynchronously from the respective clock grid 114.

In the embodiments described above, level-sensitive scan design (LSSD) latches L1 and L2 (FIG. 2) can use master-slave flip-flops. The master L1 flip-flop has a data input data_in and a scan input scan_in. The data input data_in is captured with the c1 clock from the respective local clock splitter.

In the embodiments described above, in each X or Y logic, the global scan clocks a_clk and b_clk (FIG. 2) are ANDed with the individual scan enable signals (scan_enable_x or scan_enable_y) to form internal scan clocks clka and clkb. The internal scan clock clka is used to capture scan data at the scan input scan_in (which is fed by the scan output of a different latch not shown in the figures) into the master L1 flip-flop. The slave L2 flip-flop only gets data from the output of the master L1 flip-flop. The c2 output of the clock splitter is ORed with the internal scan clock clkb to capture the data from the master L1 into the slave L2.

In the embodiments described above, the scan control circuits 112a and 112b can be used to shift scan data serially through latches that are chained together (i.e., scan_out is coupled to scan_in) without modification of the values along the way.

In the embodiments described above, the clock control circuits 110a and 110b (FIG. 1) can be used to enable the updating of latches with the computational results each machine cycle. The scanning operation controlled by the scan control circuits 112a and 112b and the updating/functional operation controlled by the clock control circuits 110a and 110b are mutually exclusive within the same functional unit X or Y logic (i.e., at any point in time, each X or Y logic can be in either scanning operation or updating/functional operation, but not both.

In the embodiments described above, with reference to FIG. 2, the clock control circuits 110a and 110b and the scan control circuits 112a and 112b can be driven from the firmware interface 180. The implementation of the firmware interface 180 could be I2C or JTAG (IEEE 1149.1), or as in our preferred embodiment a proprietary Serial Communication (SCOM) interface which can be used by out-of-band firmware running on an external service processor, or host firmware running on one or more processor cores in the system.

In the embodiments described above, with reference to FIG. 1, the clock control circuits 110a and 110b of the processor chip 100a and the cache chip 100b can be setup early during system boot time by the asynchronous firmware interface 180. Each clock control circuit 110a/110b runs on a clock domain (i.e., vital_clk_gate of FIG. 2). Selfsync functionality within the clock control circuits 110a and 110b of the processor chip 100a and the cache chip 100b is responsible to get a so-called phase counter aligned during early boot time. Selfsync between the processor chip 100a and the cache chip 100b needs to have synchronous clocks running on both chips 100a and 100b.

In the embodiments described above, the phase counters 110a' and 110b' (FIG. 1) are responsible for generating phase_hold_x signals (FIG. 2) which are used by the local clock splitters. Phase hold signals (like phase_hold_x) can be used to run X or Y logics on a given chip on a divide down frequency. Applications on a given chip are 1:1 (as shown in FIGS. 3-4), 2:1, 4:1, or 8:1 divide down frequencies, etc.

For instance, if 4:1 divide down frequencies are used, then phase hold counter increments its value every clock cycle based on clkg. Signal phase_hold_x is asserted to a value of ZERO when the counter reaches its value of hex3 or hex7. If glb_clk_gate_x is activated, the c2 launch clock is just activated if phase_hold_x has a value of ZERO. During the inactive state of c2, c1 clock is asserted to ONE.

In the embodiments described above, each the EI domain can be partitioned into X and Y logics. The X logic hosts all latches which need to enable a data transfer via the elastic interface (191X/192X/193X of FIG. 1) between the processor chip 100a and the cache chip 100b and also between the processor chip 100a and the ASIC chips 150a and 150b. Not shown are BNDY scan latches and Driver, Receiver circuits which are needed to connect between the chips 100a, 100b, 150a, and 150b.

In the embodiments described above, each Y logic (FIGS. 1-2) is responsible for generating an early reference clock (ASIC_clkfa/ASIC_clkfb) to the respective ASIC chip 150a/150b. A Master-Slave Flip Flop with an inverter connected between the data_in and the data_out is responsible for the generation of toggle signal based on the provided c1 and c2 clocks by the local clock splitter as shown in FIG. 2. A differential driver (250Y) is responsible to drive the early reference clock signal off chip to the connected ASIC chip 150a/150b. With the help of a MUX (240Y2) in conjunction with boundary scan latches (260Y), the differential driver (250Y) could be tested on wafer level. DI1 (Driver Inhibit 1) and DI2 (Driver Inhibit2) signals (FIG. 2) of the differential driver (250Y) are used to control the differential driver (250Y).

In the embodiments described above, each Y logic (120a1Y in FIG. 2) can comprise two blocks: (1) boundary scan circuit (260Y) for boundary scan test (boundary scan test is test of the differential diver as well as test of the Off Chip connection), and (2) a functional block comprising L1/L2 latch (230Y1+230Y2) with a feedback connection via an inverter (280Y). This L1L2 latch (230Y1+230Y2) changes its value every clock cycle. The output of this L1L2 latch (230Y1+230Y2) is used as a reference clock for the respective ASIC chip 150a/150b. The two blocks are used in an exclusive way. The selection is done by a multiplexer (240Y2). The enablement of the differential driver 250Y is done by the DI1 (driver inhibit1) signal and the DI2 (driver inhibit2) signal.

DI1 signal is used for all non test IO drivers of the entire chip. DI1 is used to fence the entire chip logic during selftest to be independent against potential external Input and Output signal switching conditions. DI2 is a logical enable signal. This signal is unique for a given logic block. For the early reference clock to the ASIC chips 150a/150bs, this signal is controlled by firmware interface 180 and asserted just prior to the usage of the entire logic.

In the embodiments described above, in an EI domain, the Y logic is separated from the X logic with respect to scanning (i.e., scanning operation of the X logic and scanning operation of the Y logic do not have to be performed simultaneously). Also, in an EI domain, the Y logic is separated from the X logic with respect to clocking (i.e., the functional operation of the X logic and the functional operation of the Y logic do not have to be performed simultaneously).

In the embodiments described above, due to the presence of MUX 240Y1 (FIG. 2) in the Y logic 120a1Y, the X logic and the Y logic could be clocked identically by the assertion of identical clock control signal glb_clk_gate_x.

In the embodiments described above, chip selftest of chip 100a/100b (FIG. 1) does not involve the Y logics anymore (the Y logics can be tested in a different way, e.g., on wafer level). The DI1 signal of the differential driver 250Y has to be tied to ZERO (i.e., TIE) to be able to send out an early reference clock (ASIC_clkfa/ASIC_clkfb) to the respective ASIC chip (150a/150b) while chip selftest of chip 100a/100b is running.

In the embodiments described above, in the chip 100a/100b, the Y logic can be started together with the X logic from a clocking point of view. Then, the Y logic remains in the functional mode (also called clock running state) while the X logic exits the functional mode so as to be included in chip selftest of chip 100a/100b. When the X logic re-enters the functional mode (after a successful completion of selftest), the X logic and the Y logic are synchronous to each other from a clocking point of view.

In the embodiments described above, the latches of the boundary scan circuit 260Y (FIG. 2) can be assigned to their own scan chain so that a short access time is guaranteed. This helps improve overall test time. The latches of the boundary scan circuit 260Y (FIG. 2) are not separated from a clocking point of view, meaning the latches of the boundary scan circuit 260Y (FIG. 2) are clocked in a same manner as the manner in which the latches L1/L2 of the X/Y logics are clocked.

In the embodiments described above, the latches of the boundary scan circuit 260Y (FIG. 2) can have a feedback connection via an inverter (similar to the toggle latch 230Y1_230Y2+280Y of FIG. 2). This feedback connection is optional, meaning a MUX (not shown) needs to be in the path to not have the inversion during boundary test usage. A latch with a feedback connection via an inverter is called a toggle latch. This toggle latch could be used to generate a reference clock (like ASIC_clkfa/ASIC_clkfb) to the ASIC chips 150a/150b.

In the embodiments described above, the chip initialization can be run sequentially while it is made sure to collect all the needed data from the ASIC chips 150a/150b before stopping the processor clocks.

In the embodiments described above, an early reference clock can be provided to the ASIC chips 150a/150b using the connected processor vital clock. Then, starting the vital clock is one of the first steps in the connected processor (100a) initialization sequence. After the reference clock is used for the ASIC chip 150a/150b, it is possible to initialize the connected processor 100a and the ASIC chips 150a/150b in parallel.

In the embodiments described above, an EI domain is a domain to establish High Speed data transfer across chips by talking off chips delays into account.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A digital system, comprising:
  a processor chip which includes a first elastic interface domain, wherein the first elastic interface domain comprises a first processor X logic and a first processor Y logic, wherein the first processor X logic comprises first X latches, and wherein the first processor Y logic comprises first Y latches; and
  a first ASIC (application-specific integrated circuit) chip electrically coupled to the processor chip, wherein the first processor X logic and the first processor Y logic are configured to be simultaneously in a functional mode, wherein the first processor X logic is configured to switch from the functional mode to a scanning mode while the first processor Y logic remains in the functional mode, and wherein in response to the first processor Y logic being in the functional mode, the first processor Y logic is configured to generate a first reference ASIC clock signal to the first ASIC chip.

2. The digital system of claim 1,
  wherein the first ASIC chip comprises a first ASIC X logic electrically coupled to the first processor X logic,
  wherein the first ASIC X logic and the first processor X logic are configured to exchange data with each other in response to both the first ASIC X logic and the first processor X logic being in the functional mode,
  wherein the first processor X logic is configured to switch from the scanning mode back to the functional mode while the first processor Y logic remains in the functional mode, and
  wherein the first processor X logic and the first processor Y logic are configured to be synchronous to each other from a clocking point of view whenever both the first processor X logic and the first processor Y logic are simultaneously in the functional mode.

3. The digital system of claim 1, further comprising a second ASIC chip electrically coupled to the processor chip,
  wherein the processor chip further includes a second elastic interface domain,
  wherein the second elastic interface domain comprises a second processor X logic and a second processor Y logic,
  wherein the second processor X logic comprises second X latches,
  wherein the second processor Y logic comprises second Y latches, wherein the second processor X logic and the second processor Y logic are configured to be simultaneously in the functional mode, wherein the second processor X logic is configured to switch from the functional mode to the scanning mode while the second processor Y logic remains in the functional mode, and wherein in response to the second processor Y logic being in the functional mode, the second processor Y logic is configured to generate a second reference ASIC clock signal to the second ASIC chip.

4. The digital system of claim 3, wherein the second ASIC chip comprises a second ASIC X logic electrically coupled to the second processor X logic, and wherein the second ASIC X logic and the second processor X logic are configured to exchange data with each other in response to both the second ASIC X logic and the second processor X logic being in the functional mode.

5. The digital system of claim 4, further comprising a cache chip electrically coupled to the processor chip, wherein the processor chip further includes a third elastic interface domain, wherein the third elastic interface domain comprises a third processor X logic, wherein the third processor X logic comprises third X latches, wherein the third processor X logic is configured to switch from the functional mode to the scanning mode, and wherein the cache chip comprises a cache X logic electrically coupled to the third processor X logic, and wherein the cache X logic and the third processor X logic are configured to exchange data with each other in response to both the cache X logic and the third processor X logic being in the functional mode.

6. The digital system of claim 1, wherein the processor chip further includes a clock control circuit and a scan control circuit, wherein the clock control circuit is configured to assert a global clock gate signal to the first processor X logic and the first processor Y logic resulting in the first processor X logic the first processor Y logic entering the functional mode, wherein the scan control circuit is configured to assert an X scan enable signal to the first processor X logic resulting in the first processor X logic entering the scanning mode, and wherein the scan control circuit is further configured to assert a Y scan enable signal to the first processor Y logic resulting in the first processor Y logic entering the scanning mode.

7. The digital system of claim 6, wherein the first processor Y logic further comprises (a) a first multiplexer, (b) a local clock splitter electrically coupled to the first multiplexer, and (c) a first toggle latch including the first Y latches and being electrically coupled to the local clock splitter, wherein the first multiplexer is configured to electrically couple the global clock gate signal to the local clock splitter resulting in the local clock splitter generating functional clock signals to the first toggle latch, and wherein in response to receiving the functional clock signals from the local clock splitter, the first toggle latch is configured to generate the first reference ASIC clock signal.

8. The digital system of claim 7, further comprising a firmware interface, wherein the first multiplexer is further configured to electrically couple a vital clock gate signal from the firmware interface to the local clock splitter resulting in the local clock splitter maintaining said generating the functional clock signals to the first toggle latch while the first processor X logic switches from the functional mode to the scanning mode.

9. The digital system of claim 8, wherein the first processor Y logic further comprises a boundary scan circuit and a second multiplexer, wherein the boundary scan circuit comprises a second toggle latch, wherein the local clock splitter is further configured to send the functional clock signals to the second toggle latch, and wherein in response to receiving the functional clock signals from the local clock splitter, the second toggle latch is configured to generate the first reference ASIC clock signal through the second multiplexer to the first ASIC chip.

10. The digital system of claim 9, wherein the second multiplexer is configured to switch from electrically coupling the second toggle latch to the first ASIC chip to electrically coupling the first toggle latch to the first ASIC chip.

11. A circuit operation method, comprising:

providing a digital system which includes (a) a processor chip which comprises a first elastic interface domain, wherein the first elastic interface domain comprises a first processor X logic and a first processor Y logic, wherein the first processor X logic comprises first X latches, and wherein the first processor Y logic comprises first Y latches and (b) a first ASIC (application-specific integrated circuit) chip electrically coupled to the processor chip;

setting the first processor X logic and the first processor Y logic simultaneously in a functional mode;

after said setting is performed, switching the first processor X logic from the functional mode to a scanning mode while the first processor Y logic remains in the functional mode; and in response to the first processor Y logic being in the functional mode, using the first processor Y logic to generate a first reference ASIC clock signal to the first ASIC chip.

12. The method of claim 11, further comprising exchanging data between (i) a first ASIC X logic of the first ASIC chip and (ii) the first processor X logic in response to both the first ASIC X logic and the first processor X logic being in the functional mode.

13. The method of claim 11, further comprising:

setting a second processor X logic and a second processor Y logic of a second elastic interface domain of the processor chip simultaneously in a functional mode, wherein the second processor X logic comprises second X latches, and wherein the second processor Y logic comprises second Y latches;

switching the second processor X logic from the functional mode to the scanning mode while the second processor Y logic remains in the functional mode; and in response to the second processor Y logic being in the functional mode, using the second processor Y logic to generate a second reference ASIC clock signal to a second ASIC chip.

14. The method of claim 13, further comprising, after said switching the first processor X logic from the functional mode to the scanning mode is performed, switching the first processor X logic from the scanning mode back to the functional mode resulting in both the first processor X logic and the first processor Y logic being synchronous to each other from a clocking point of view,
   wherein said setting the first processor X logic and the first processor Y logic simultaneously in the functional mode results in both the first processor X logic and the first processor Y logic being synchronous to each other from a clocking point of view.

15. The method of claim 14, further comprising:
switching a third processor X logic of a third elastic interface domain of the processor chip from the functional mode to the scanning mode, wherein the third processor X logic comprises third X latches; and
exchanging data between a cache X logic of a cache chip and the third processor X logic in response to both the cache X logic and the third processor X logic being in the functional mode.

16. The method of claim 11,
   wherein said setting the first processor X logic and the first processor Y logic simultaneously in the functional mode comprises using a clock control circuit of the processor chip to assert a global clock gate signal to the first processor X logic and the first processor Y logic resulting in the first processor X logic and the first processor Y logic entering the functional mode; and
   wherein said switching the first processor X logic from the functional mode to the scanning mode comprises using a scan control circuit of the processor chip to assert an X scan enable signal to the first processor X logic resulting in the first processor X logic entering the scanning mode.

17. The method of claim 16, wherein said using the first processor Y logic to generate the first reference ASIC clock signal to the first ASIC chip comprises:
   using a first multiplexer of the first processor Y logic to electrically couple the global clock gate signal to a local clock splitter of the first processor Y logic resulting in the local clock splitter generating functional clock signals to a first toggle latch, wherein the first toggle latch includes the first Y latches; and
   using the first toggle latch to generate the first reference ASIC clock signal in response to the first toggle latch receiving the functional clock signals from the local clock splitter.

18. The method of claim 17, wherein said using the first processor Y logic to generate the first reference ASIC clock signal to the first ASIC chip further comprises using the first multiplexer to electrically couple a vital clock gate signal from a firmware interface to the local clock splitter resulting in the local clock splitter maintaining said generating the functional clock signals to the first toggle latch while the first processor X logic switches from the functional mode to the scanning mode.

19. The method of claim 18, further comprising:
   using the local clock splitter to send the functional clock signals to a second toggle latch of a boundary scan circuit of the first processor Y logic; and
   in response to the second toggle latch receiving the functional clock signals from the local clock splitter, using the second toggle latch to generate the first reference ASIC clock signal through a second multiplexer of the first processor Y logic to the first ASIC chip.

20. The method of claim 19, further comprising switching the second multiplexer from electrically coupling the second toggle latch to the first ASIC chip to electrically coupling the first toggle latch to the first ASIC chip.

* * * * *